United States Patent
Bedworth et al.

(10) Patent No.: US 9,169,575 B1
(45) Date of Patent: Oct. 27, 2015

(54) METHODS FOR RELEASING GRAPHENE FROM A METAL SUBSTRATE BY ELECTROWETTING

(71) Applicant: LOCKHEED MARTIN CORPORATION, Bethesda, MD (US)

(72) Inventors: Peter V. Bedworth, Los Gatos, CA (US); Jacob Louis Swett, Mountain View, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 14/195,802

(22) Filed: Mar. 3, 2014

Related U.S. Application Data (60) Provisional application No. 61/772,487, filed on Mar. 4, 2013.

(51) Int. Cl.
| | |
|---|---|
| *H01L 21/30* | (2006.01) |
| *C25D 1/14* | (2006.01) |
| *H01L 21/311* | (2006.01) |
| *H01L 21/308* | (2006.01) |
| *C23F 1/00* | (2006.01) |

(52) U.S. Cl.
CPC .............. *C25D 1/14* (2013.01); *H01L 21/3086* (2013.01); *H01L 21/311* (2013.01); *C23F 1/00* (2013.01)

(58) Field of Classification Search
CPC ........ C01B 31/02; C01B 31/0453; C25B 1/04
USPC .......................................................... 216/83
See application file for complete search history.

(56) References Cited

U.S. PATENT DOCUMENTS

2014/0130972 A1* 5/2014 Ren et al. ................... 156/249

FOREIGN PATENT DOCUMENTS

CN          102719877      * 10/2012  ............... C25F 3/00

OTHER PUBLICATIONS

Wang et al., "Electrochemical Delamination of CVD-Grown Gaphene Film: Toward the Reyclable Use of Copper Catalyst," ACS Nano, 2011, pp. 9927-9933, vol. 5, No. 12.
Zhu et al., "Capilay wave popagation during the delamination of graphene by the precursor films in electo-elasto-capillarity," Scientific Reports, 2012, pp. 1-6, vol. 2.

* cited by examiner

*Primary Examiner* — Lan Vinh
*Assistant Examiner* — Mahmoud Dahimene
(74) *Attorney, Agent, or Firm* — McDermott Will & Emery LLP (57) ABSTRACT

It is often desirable to release graphene from its growth substrate. Present graphene release techniques can damage the graphene and produce significant quantities of hazardous waste. Electrowetting techniques can be used in alternative approaches for releasing graphene from its growth substrate. Methods for releasing graphene by electrowetting can include providing a metal substrate having graphene adhered thereto, applying a dielectric layer to the graphene to form a coated structure, placing the coated structure in a liquid medium, establishing an electrical potential between the metal substrate and a conductor disposed proximate to at least a portion of the dielectric layer such that the electrical potential induces infiltration of the liquid medium between at least a portion of the metal substrate and the graphene, and releasing the graphene from the metal substrate in the presence of the infiltrated liquid medium. The electrical potential can be maintained until the graphene is released.

22 Claims, 3 Drawing Sheets

METHODS FOR RELEASING GRAPHENE FROM A METAL SUBSTRATE BY ELECTROWETTING

CROSS-REFERENCE TO RELATED APPLICATIONS

This application claims the benefit of priority under 35 U.S.C. §119 from U.S. Provisional Patent Application 61/772,487, filed Mar. 4, 2013, which is incorporated herein by reference in its entirety.

STATEMENT REGARDING FEDERALLY SPONSORED RESEARCH OR DEVELOPMENT

Not applicable.

FIELD

The present disclosure generally relates to carbon nanomaterials, and, more specifically, to methods for manipulating graphene.

BACKGROUND

Graphene represents an atomically thin layer of carbon in which the carbon atoms reside at regular two-dimensional lattice positions within a single sheet or a few stacked sheets (e.g., about 10 or less) of fused six-membered carbon rings. In its various forms, this material has garnered widespread interest for use in a number of applications, primarily due to its favorable combination of high electrical and thermal conductivity values, good in-plane mechanical strength, and unique optical and electronic properties. Of particular interest to industry are large-area graphene films for applications such as, for example, special barrier layers, coatings, large area conductive elements (e.g., RF radiators or antennas), and flexible electronics. A number of contemplated graphene applications have also been proposed for carbon nanotubes, since these two materials have certain properties that are comparable to one another. However, graphene holds an advantage over carbon nanotubes in that it can generally be produced in bulk much more inexpensively than can the latter, particularly over large surface areas, thereby addressing perceived supply and cost issues that have been commonly associated with carbon nanotubes.

Despite graphene generally being synthesized more easily than are carbon nanotubes, the form in which the graphene is produced can be problematic for certain applications. The most scalable processes for producing graphene involve depositing a graphene film on a growth substrate, most commonly a copper substrate, by chemical vapor deposition (CVD) or plasma-enhanced chemical vapor deposition (PECVD). Removing the graphene from its growth substrate can often be desirable. For example, removing the graphene from its growth substrate can often involve transferring the graphene to a secondary substrate having properties that better meet the needs of a particular application. However, graphene is often firmly adhered to its growth substrate, thereby making its removal difficult.

Conventional graphene removal processes can be problematic in many aspects, not the least of which is damaging the graphene during its liberation from the growth substrate. One way in which graphene can be removed from its growth substrate is through dissolution of the growth substrate (e.g., with an acid), leaving behind the free graphene. However, an unsupported graphene can become mechanically or chemically damaged when released in this manner. Moreover, dissolution processes can be slow, produce significant quantities of waste, and do not permit reuse of the sacrificial growth substrate. Another technique that has been used for releasing graphene from its growth substrate involves electrolytic production of hydrogen gas between the graphene and its growth substrate. Stress resulting from hydrogen bubble formation during electrolysis, although resulting in removal of the graphene from its growth substrate, can likewise produce undesirable mechanical damage within the graphene.

In view of the foregoing, improved processes for releasing graphene from its growth substrate would represent a substantial advance in the art. The present disclosure satisfies the foregoing need and provides related advantages as well.

SUMMARY

In some embodiments, methods for releasing graphene from its growth substrate can include providing a metal substrate having graphene adhered thereto, applying a dielectric layer to the graphene to form a coated structure, placing the coated structure in a liquid medium, establishing an electrical potential between the metal substrate and a conductor disposed proximate to at least a portion of the dielectric layer, and releasing the graphene from the metal substrate in the presence of an infiltrated liquid medium. The electrical potential induces infiltration of the liquid medium between at least a portion of the metal substrate and the graphene. The electrical potential is maintained until the graphene is released.

In some embodiments, methods for releasing graphene from its growth substrate can include providing a coated structure containing a metal substrate having graphene adhered thereto and a polymer layer coated on the graphene, forming an electrical connection to the metal substrate and a conductor disposed proximate to at least a portion of the polymer layer, placing the coated structure in a liquid medium, establishing an electrical potential between the metal substrate and the conductor, infiltrating the liquid medium between at least a portion of the metal substrate and the graphene in the presence of the electrical potential, and releasing the graphene from the metal substrate in the presence of the infiltrated liquid medium. The electrical potential is maintained until the graphene is released.

The foregoing has outlined rather broadly the features of the present disclosure in order that the detailed description that follows can be better understood. Additional features and advantages of the disclosure will be described hereinafter. These and other advantages and features will become more apparent from the following description taken in conjunction with the drawings.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

The present disclosure is directed, in part, to methods for releasing graphene from its growth substrate (e.g., a metal substrate) in the presence of an applied electrical potential, specifically by an electrowetting process. The present disclosure is also directed, in part, to compositions including graphene that has been released from its growth substrate by an electrowetting process.

As discussed above, there remain significant issues associated with removing graphene from its growth substrate. Present graphene removal processes can be slow, costly, and produce significant quantities of waste. Moreover, graphene can become damaged during existing removal processes, which can sometimes result in deterioration of its desirable properties. Any of these factors can complicate the deployment of graphene in various applications.

The present inventors recognized that electrowetting techniques can be used to affect graphene removal from its growth substrate and provide a number of advantages over existing graphene removal processes. Before further discussing such electrowetting techniques and the advantages thereof in the context of graphene removal, a brief description of conventional electrowetting processes will first be provided.

The concept and practice of modifying the wetting properties of a surface by a liquid medium through the application of an electric field thereto has been well studied and described. This process will be referred to herein as "electrowetting" and will not be described in any significant detail herein, except as needed to understand one or more embodiments of the present disclosure. Briefly, electrowetting processes lower the surface tension between a liquid medium and a surface through the application of an electric field thereto, thereby changing the contact angle between the liquid medium and the surface. Without being bound by any theory or mechanism, it is believed that application of the electric field results in a reorganization of the liquid medium's molecules to produce a change in its wetting properties. The decreased surface tension of the liquid medium can allow it to move more readily on the surface, such as by capillary action. This process will be referred to herein as "induced electrocapillarity."

Conventional electrowetting processes are commonly employed in micro- and nano-fluidic devices. Although induced electrocapillarity is often desirable in such devices to ensure their proper operation, it can also introduce certain types of failure modes into the devices. Specifically, instead of a liquid medium moving into a desired flow pathway, the liquid medium can instead infiltrate between a conductor and a dielectric layer in the presence of an applied potential. Infiltration of the liquid medium between a conductor and a dielectric layer in this manner can ultimately produce delamination of the conductor from the dielectric layer over time, oftentimes resulting in failure of the device.

The present inventors recognized that the seemingly undesirable delamination of a conductor from a dielectric layer during electrowetting could instead be advantageously employed for removal of graphene from its growth substrate. At first glance, it might appear that a graphene-coated metal substrate does not present a conductor/dielectric layer configuration, given the electrical conductivity of graphene. However, the present inventors recognized that this is not the case, since the greatest electrical conductivity of graphene is realized in-plane within each graphene sheet. Through-plane, particularly when multiple sheets of graphene are stacked upon one another, the electrical conductivity is much lower, and the graphene instead behaves like a dielectric material. Thus, the present inventors recognized that electrowetting processes might be used to remove graphene from its growth substrate by taking advantage of the through-plane dielectric properties of the graphene.

Electrowetting processes for removal of graphene from its growth substrate can present a number of advantages over conventional graphene removal processes. Electrowetting processes are considered to be advantageous over electrolytic processes, since electrowetting processes do not generate hydrogen gas from the liquid medium, thereby eliminating a potential graphene degradation mechanism from play. In addition, electrowetting processes utilize a much lower energy input than do electrolytic processes, thereby reducing operating costs. Compared to dissolution techniques for removing graphene from its growth substrate, electrowetting processes can be advantageous in not sacrificing the growth substrate or producing significant quantities of hazardous waste. Because electrowetting processes can allow a growth substrate to be readily recycled, engineered growth substrates employing specialty alloys or patterning that are economically unfeasible for sacrificial use can also be effectively used in the embodiments described herein. Use of specialty growth substrates can sometimes result in production of graphene having improved properties or a particularly desired set of properties. Therefore, the graphene removal processes described herein can enable the production of graphene compositions that are not readily attainable by conventional growth techniques.

As a further advantage, the electrowetting processes described herein can be compatible with releasing the graphene in a supported state. Specifically, the graphene can be coated with a polymer layer or other dielectric layer while still on its growth substrate, and this layer can remain adhered to the graphene once separation from the growth substrate occurs. The supported graphene can be used directly in various applications or undergo further processing, including transfer to a secondary substrate for use in a particular application. Releasing the graphene from its growth substrate in a supported state can result in a decreased incidence of damage to the graphene. It is believed that the polymer or other dielectric layer is compatible with the electrowetting conditions, since the through-plane dielectric constant of the graphene and that of the polymer or other dielectric layer are more closely matched with one another than are the through-plane dielectric constant of the graphene and that of the growth substrate. That is, since the dielectric layer and the through-plane graphene are both dielectric materials, the graphene can delaminate slower from the dielectric layer than it does from the growth substrate.

Although a polymer or other dielectric layer can be advantageous in the respects outlined above, it is to be recognized that the polymer or other dielectric layer can also be omitted in the embodiments described herein. Specifically, the through-plane dielectric behavior of the graphene can be sufficient to facilitate an electrowetting-based release of graphene from its growth substrate, albeit in an unsupported state. Thus, the techniques described herein offer considerable flexibility in the graphene composition that is ultimately being produced.

As used herein, the term "breakdown voltage" refers to the applied voltage above which an arc forms between a metal substrate and a conductor disposed proximate thereto. At the breakdown voltage, a dielectric layer disposed between a metal substrate and a conductor can become electrically conductive and/or no longer promote electrical isolation between the metal substrate and the conductor. Typical electric fields that can result in dielectric breakdown in the embodiments described herein can range between about 100 V/m and about 1 MV/m, although the electric field may be higher, such as up to about 10 MV/m.

In some embodiments, methods for removing graphene from a growth substrate can include providing a metal substrate having graphene adhered thereto, applying a dielectric layer to the graphene to form a coated structure, placing the coated structure in a liquid medium, establishing an electrical potential between the metal substrate and a conductor disposed proximate to at least a portion of the dielectric layer, and releasing the graphene from the metal substrate in the presence of an infiltrated liquid medium. The electrical potential induces infiltration of the liquid medium between at least a portion of the metal substrate and the graphene. The electrical potential is also maintained until the graphene is released. Accordingly, in various embodiments, the electrical potential results in an electrowetting process, whereby the liquid medium encroaches in between at least a portion of the graphene and the metal substrate.

For purposes of this disclosure, a conductor and a dielectric layer will be considered to be proximate to one another if they are separated by about 10 mm or less, including the condition of being in contact with one another. In more particular embodiments, a conductor and a dielectric layer will be considered to be proximate to one another, if they are separated by about 5 mm or less, or about 2 mm or less, or about 1 mm or less, or about 500 µm or less, or about 100 µm or less. The chosen separation between the conductor and the dielectric layer can influence the applied potential that ultimately results in removal of the graphene from the metal substrate. The proximity of the conductor and the dielectric layer to one another, as well as the thickness of the dielectric layer, can also be chosen such that the separation between the metal substrate and the conductor is maintained at about 5 mm or less, or about 2 mm or less, or about 1 mm or less, or about 500 µm or less, or about 100 µm or less.

In various embodiments, the techniques described herein do not result in the production of hydrogen gas. That is, in various embodiments, establishing the electrical potential does not form hydrogen gas from the liquid medium. Thus, the established electrical potential can be chosen to reside within the effective working potential range for the chosen liquid medium. In some or other various embodiments, the established electrical potential can be below a breakdown voltage of at least the dielectric layer. Further discussion regarding suitable electrical potentials is provided below.

In some embodiments, the methods described herein can include applying a dielectric layer to the graphene, as referenced above. The deposition technique can occur by any suitable method for placing a thin film on a surface. Illustrative deposition techniques that can be used in conjunction with the embodiments described herein include vapor deposition techniques, solution deposition techniques (including sol-gel processes, dip coating processes, spray coating processes, spin coating processes, and the like), or any combination thereof. Depending on the desired thickness of the dielectric layer and the particular dielectric material being deposited, one having ordinary skill in the art will be able to choose a suitable deposition technique.

Suitable dielectric materials for use in the embodiments described herein are not believed to be particularly limited. In some instances, a suitable dielectric material can be chosen based upon the degree of support needed once the graphene has been released from the metal substrate. In some or other instances, a suitable dielectric material can be chosen based upon the end application in which the graphene is to be deployed. That is, in some embodiments, the dielectric material can be directly utilized in an end application with the graphene adhered thereto, with the dielectric material being chosen for compatibility in the desired end application. Additionally, suitable dielectric materials and the thickness thereof can be chosen to provide electrical isolation between the metal substrate and the conductor at the electrical potential being utilized during the graphene removal process.

In some embodiments, the dielectric material can include an oxide ceramic such as silicon oxide or aluminum oxide, for example. In some or other embodiments, the dielectric material can include a non-oxide ceramic such as, for example, silicon carbide, a transition metal carbide, or the like. Transition metal nitrides, borides, and silicides can be utilized similarly, provided that they are not substantially electrically conductive. In some embodiments, a diamond film can constitute the dielectric material.

In some embodiments, the dielectric layer can include a polymer. Polymers can be particularly desirable in the embodiments described herein due to their flexibility. Suitable polymers are not believed to be particularly limited. As with ceramics and other dielectric materials, choice of a suitable polymer for use in conjunction with the embodiments described herein can be based on a variety of factors, including, but not limited to, the desired degree of support to be conveyed to the graphene, flexibility and chemical stability of the polymer, and the end application in which the graphene is to be deployed. In some embodiments, the dielectric layer can include a polytetrafluoroethylene layer. Polytetrafluoroethylene or a copolymer thereof can be particularly desirable in this regard, since it is not readily wetted by aqueous liquids in the absence of an applied electrical potential but undergoes facile wetting once exposed to an electrical potential. Other suitable polymers can include, for example, polyethylene, polypropylene, polystyrene, and the like.

In various embodiments, a thickness of the dielectric layer can be chosen to convey a desired degree of support to the graphene once it has been removed from its growth substrate. In addition, the thickness of the dielectric layer can be chosen to support the electric field utilized in the graphene removal processes described herein. That is, in various embodiments, the thickness of the dielectric layer can be chosen to remain below the breakdown voltage, particularly at an electric field of up to about 10 MV/m.

Depending on the chosen electric field, the thickness of the dielectric layer can vary over a wide range in order to promote electrical isolation. In various embodiments, the dielectric layer can range between about 50 nm to about 10 mm in thickness. In more particular embodiments, the dielectric layer can range between about 10 µm and about 100 µm in thickness, or between about 100 µm and about 2 mm in thickness, including between 500 µm and about 1 mm in thickness.

In some embodiments, the graphene can be obtained already coated with a dielectric layer (e.g., a polymer layer) upon a growth substrate. In this regard, methods for removing graphene from a growth substrate according to the embodiments described herein can include providing a coated structure containing a metal substrate having graphene adhered thereto and a polymer layer coated on the graphene, forming an electrical connection to the metal substrate and a conductor disposed proximate to at least a portion of the polymer layer, placing the coated structure in a liquid medium, establishing an electrical potential between the metal substrate and the conductor, infiltrating the liquid medium between at least a portion of the metal substrate and the graphene in the presence of the electrical potential, and releasing the graphene from the metal substrate in the presence of the infiltrated liquid medium. In such embodiments, the electrical potential can be maintained until the graphene is released.

As referenced above, an electrical potential can be maintained until the graphene is released from the metal substrate. The time required for removal to take place is not considered to be particularly limited in the embodiments described herein. Any suitable technique can be used to monitor the delamination of the graphene from the metal substrate. In some embodiments, the delamination can be monitored visually, including microscopic observation. In some or other embodiments, the delamination can be monitored electrically, such as measuring a change in capacitance, for example. Once a change in capacitance has been observed, the potential can be removed.

Depending on the nature of the metal substrate and the particular conditions under which the graphene is grown on the metal substrate, the graphene can be single layer graphene, double layer graphene, triple layer graphene, or multi-layer graphene. For example, sub-atmospheric pressure growth of graphene on a copper substrate can favor deposition of single layer graphene, whereas atmospheric pressure growth can favor the deposition of multi-layer graphene. As used herein, the term "atmospheric pressure" refers to the magnitude of the air pressure at sea level, approximately 760 torr. As used herein, the term "sub-atmospheric pressure" refers to any pressure that is less than atmospheric pressure. Regardless of the number of graphene layers that are present, the graphene can be released from the metal substrate in substantially the same manner according to the embodiments described herein.

In various embodiments, the graphene can be grown on the metal substrate by CVD or PECVD techniques. Suitable techniques for growth of graphene under CVD or PECVD conditions will be familiar to one having ordinary skill in the art and will not be described in any particular detail herein. Although any suitable metal substrate can be used to affect CVD or PECVD growth of graphene for use in the graphene removal techniques described herein, a metal substrate that includes copper can be particularly advantageous for growth of graphene. Other suitable metals for growth of graphene can include, for example, nickel, ruthenium, iridium, combinations thereof and the like. The metal substrate can be formed entirely from a metal suitable for forming graphene, or a coating of a suitable metal can be applied to another type of substrate, including upon a metal substrate that is not itself suitable for growing graphene thereon.

In the embodiments described herein, an electrical potential can be established between the metal substrate and a conductor disposed proximate to at least a portion of a dielectric layer (e.g., a polymer layer) located upon the graphene. In various embodiments, a conductor that is disposed proximate to a dielectric layer can be in contact with the dielectric layer or situated close enough thereto to induce an electric field. Exemplary configurations of a conductor and a dielectric layer that are in proximity to one another are described above. For example, at a separation of 1 mm between the metal substrate and the conductor, a 10 MV/m electric field can be established with a 10 kV applied electrical potential in an electrowetting process. Similarly, in the event that the dielectric layer is omitted, and the through-plane dielectric properties of the graphene are utilized directly to induce electrowetting, the conductor can either be proximate to or in contact with the graphene.

A number of substances can constitute the liquid medium in the embodiments described herein. The liquid medium can be an electrical conductor in some embodiments, although electrical conductivity is not a required feature of the present embodiments. In other embodiments, the liquid medium can be constituted by a substance basing a large dipole moment, such as an aprotic organic solvent, a number of which are provided hereinbelow.

In some embodiments, the liquid medium can include water. In more particular embodiments, the liquid medium can include an aqueous solution, which can be an aqueous electrolyte solution. That is, in some embodiments, the liquid medium can include water and an electrolyte substance. Aqueous base electrolyte solutions and substantially neutral aqueous electrolyte solutions can be readily used in the embodiments described herein. Illustrative aqueous base electrolyte solutions can include, for example, sodium hydroxide or potassium hydroxide solutions. Illustrative neutral electrolyte solutions can include, for example, aqueous solutions of sodium chloride, potassium chloride, sodium oxide, potassium oxide, sodium sulfate, potassium sulfate, and the like. Additional aqueous electrolytes can be envisioned by one having ordinary skill in the art. An illustrative liquid medium that can be suitable for use in conjunction with the embodiments described herein can include a solution of about 0.01 M sodium hydroxide in water.

In some embodiments, the liquid medium can include an organic liquid. In some embodiments, the organic liquid can be mixed with water, and in other embodiments, the organic liquid can be used alone or in combination with one or more other organic liquids.

In some embodiments, suitable organic liquids can include aprotic organic solvents, including those that are commonly used in batteries and capacitors. Suitable aprotic organic solvents can include organic liquids such as, for example, alkyl carbonates (e.g., propylene carbonate, ethylene carbonate, butylene carbonate, dimethyl carbonate, diethyl carbonate, dipropyl carbonate, methyl ethyl carbonate, methyl butyl carbonate, methyl propyl carbonate, ethyl propyl carbonate, butyl propyl carbonate, 1,2-butylene carbonate, 2,3-butylene carbonate, 1,2-pentene carbonate, and 2,3-pentene carbonate), nitriles (e.g., acetonitrile, acrylonitrile, propionitrile, butyronitrile and benzonitrile), sulfoxides (e.g., dimethyl sulfoxide, diethyl sulfoxide, ethyl methyl sulfoxide, and benzylmethyl sulfoxide), amides (e.g., formamide, methylformamide, and dimethylformamide), pyrrolidones (e.g., N-methylpyrrolidone), lactones (e.g., γ-butyrolactone, γ-valerolactone, 2-methyl-γ-butyrolactone, and acetyl-γ-butyrolactone), phosphate triesters, nitromethane, ethers (e.g., 1,2-dimethoxyethane; 1,2-diethoxyethane; 1,2-methoxyethoxyethane; 1,2- or 1,3-dimethoxypropane; 1,2- or 1,3-diethoxypropane; 1,2- or 1,3-ethoxymethoxypropane; 1,2-dibutoxyethane; tetrahydrofuran; 2-methyltetrahydrofuran and other alkyl, dialkyl, alkoxy or dialkoxy tetrahydrofurans; 1,4-dioxane; 1,3-dioxolane; 1,4-dioxolane; 2-methyl-1,3-dioxolane; 4-methyl-1,3-dioxolane; sulfolane; 3-methylsulfolane; methyl ether; ethyl ether, propyl ether; diethylene glycol dialkyl ether; triethylene glycol dialkyl ethers; ethylene glycol dialkyl ethers; and tetraethylene glycol dialkyl ethers), esters (e.g., alkyl propionates such as methyl or ethyl propionate, dialkyl malonates such as diethyl malonate, alkyl acetates such as methyl acetate and ethyl acetate, and alkyl formates such as methyl formate and ethyl formate); and maleic anhydride.

In some embodiments, the aprotic organic solvent can be an ionic liquid. Suitable ionic liquids that can be used in conjunction with the present embodiments include, for example, benzyldimethylpropylammonium aluminum tetrachlorate, benzyldimethylammonium imide, ethylmethylammonium bisulfate, 1-butyl-3-methylimidazolium tetrafluoroborate, tetraethylammonium tetrafluoroborate, and the like. Additional ionic liquids can be envisioned by one having ordinary skill in the art.

In some embodiments, an organic electrolyte can be present in an organic liquid constituting the liquid medium in which the coated structure is placed. As used herein, the term "organic electrolyte" does not necessarily refer to an electrolyte that is organic in nature, simply that the electrolyte is most suitably used in an organic solvent, particularly an aprotic organic solvent. When present, suitable organic electrolytes can include substances such as, for example, tetraalkyammonium salts (e.g., tetraethylammonium or tetramethylammonium halides and hydroxides); quaternary phosphonium salts; and lithium, sodium or potassium tetrafluoroborates, perchlorates, hexafluorophosphates, bis(trifluoromethane)sulfonates, bis(trifluoromethane)sulfonylimides, or tris(trifluoromethane)sulfonylmethides.

As described above, in some embodiments, the conductor can be in contact with the dielectric layer. Contact of the conductor with the dielectric layer can take place if the mechanical strength of the dielectric layer is sufficient to permit contact to take place without inducing damage to the dielectric layer. In some or other embodiments, the conductor can be coated with a dielectric material, which can then contact or be in close proximity to the dielectric layer disposed on the graphene. For example, in some embodiments, the conductor can be coated with a thin layer of a dielectric material, such as a diamond film. Use of a thin dielectric layer on the conductor can be desirable to limit the likelihood of catastrophic failure occurring during operation, for example due to failure of the dielectric layer on the graphene.

Particular embodiments of the present disclosure will now be described with reference to the drawings. When substantially similar elements are described in the various FIGURES, the elements will be represented with like reference characters and only described in detail at their first occurrence. Although the FIGURES depict a conductor, such as a knife-edge electrode, that is in contact with at least a portion of a dielectric layer, it is to be recognized that the conductor can also be in close proximity to the dielectric layer, as described in detail hereinabove.

Figure 1A:
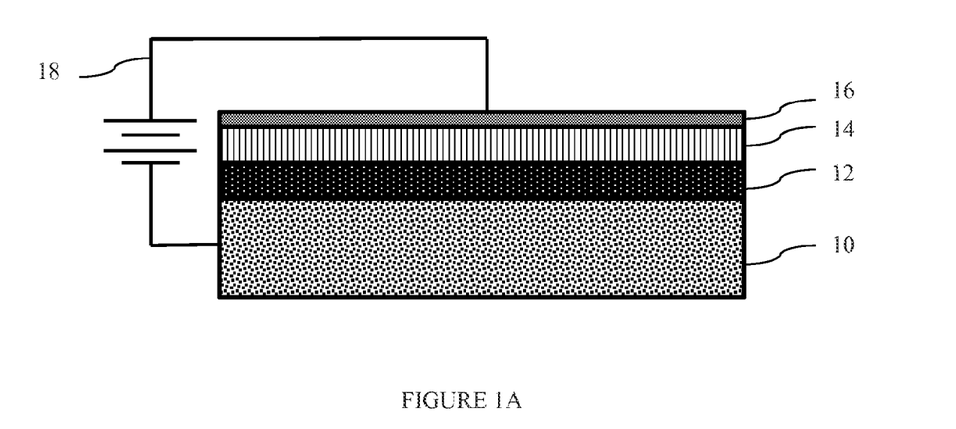
FIG. 1A shows an illustrative schematic of a substrate-bound graphene that has been coated with a polymer layer, where a conductor contacts substantially all of the polymer layer.

In some embodiments, the conductor can contact or be in close proximity to substantially all of the dielectric layer disposed on the graphene, as depicted in FIG. 1A. FIG. 1A shows an illustrative schematic of a substrate-bound graphene that has been coated with a polymer layer, where a conductor contacts substantially all of the polymer layer. Although FIG. 1A and the remaining FIGURES are described with the dielectric layer constituting a polymer layer, it is to be recognized that any suitable dielectric material can alternatively be present. As depicted in FIG. 1A, metal substrate 10 includes graphene 12 adhered thereto. Graphene 12 has polymer layer 14 disposed thereon. Contacting substantially the entirety of polymer layer 14, is conductor 16. Electrical connection 18 supplies electrical power to metal substrate 10 and conductor 16, which can establish an electrical potential at graphene 12, thereby allowing a liquid medium (not shown) to infiltrate between metal substrate 10 and graphene 12.

Figure 1B:
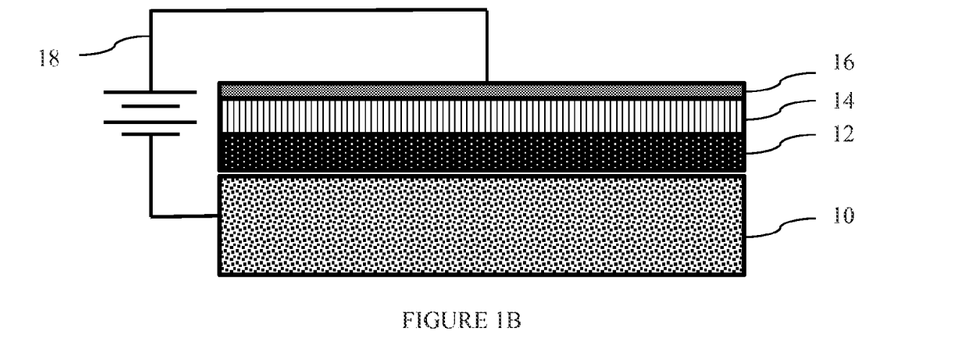
FIG. 1B shows a schematic of the configuration of FIG. 1A after the graphene has been released from the metal substrate in an electrowetting process.

FIG. 1B shows a schematic of the configuration of FIG. 1A after graphene 12 has been released from metal substrate 10 in an electrowetting process. As shown in FIG. 1B, graphene 12 remains supported by polymer layer 14 after its removal from metal substrate 10.

Figure 2:
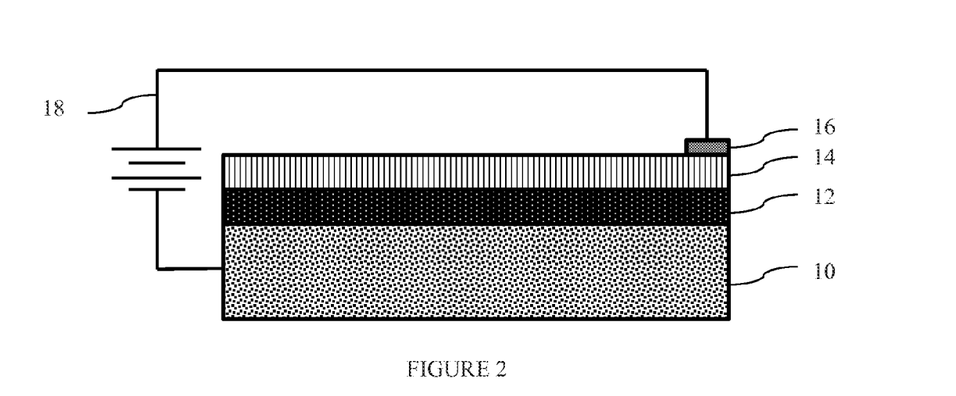
FIG. 2 shows an illustrative schematic showing a substrate-bound graphene that has been coated with a polymer layer, where a conductor contacts only a portion of the polymer layer.

In some embodiments, the conductor can contact or be in close proximity to only a portion of the dielectric layer at a particular time. FIG. 2 shows an illustrative schematic showing a substrate-bound graphene that has been coated with a polymer layer, where a conductor contacts only a portion of the polymer layer. In such embodiments, the graphene can be released from the metal substrate only at a first location. For example, in some embodiments, the graphene can be released from the metal substrate below the location where the conductor contacts the dielectric layer, with the rest of the graphene remaining adhered to the metal substrate. Further description in this regard follows below.

Figure 3:
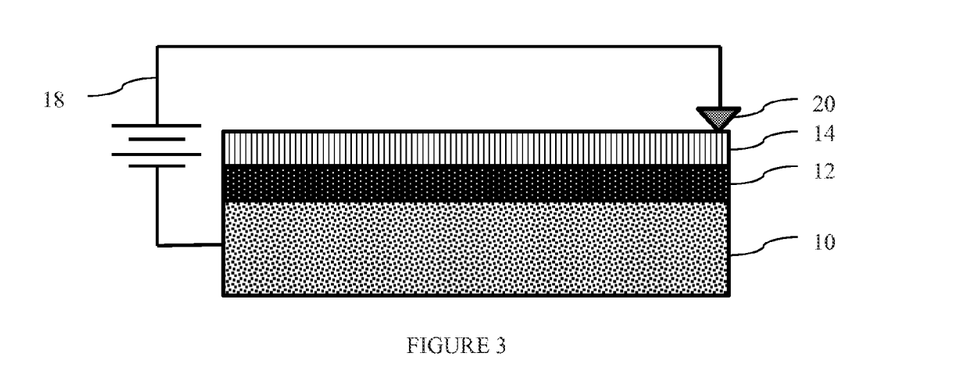
FIG. 3 shows the configuration of FIG. 2 with the conductor configured as a knife-edge electrode.

Although contacting only a portion of the dielectric layer with the conductor at a particular time would initially appear to be somewhat undesirable, since only a portion of the graphene can be released from the metal substrate, this configuration actually presents several energetic advantages. Namely, by keeping the area of contact between the conductor and the polymer layer as small as possible, high voltages per unit area can be attained without utilizing excessively high source voltages. That is, high electric fields can be obtained at relatively low applied voltages. For example, in various embodiments, the area of contact between the conductor and the dielectric layer can be adjusted such that a field of about 1 to about 50 V/$\mu$m$^2$ is applied across the graphene within the contact or close proximity area. Voltages at the power supply to achieve such field strengths can be in the range of about 10 kV or below, thereby implying an area of contact or close proximity at the dielectric layer of about 200 $\mu$m$^2$ or below. The relatively low charge stored in the capacitive interface between the metal substrate and the conductor can be desirable from a number of standpoints. Since the energy stored in a capacitor is proportional to the product of charge times the applied voltage, the amount of overall energy can be kept desirably low. By keeping the overall energy at a minimum, the likelihood of sample destruction and other deleterious consequences can be reduced in the event of an unintended arc. Moreover, by keeping the voltage relatively low, power costs can be desirably kept from being excessive and operation in an electrowetting mode, rather than an electrolysis mode, can be promoted. To achieve a low area of contact or close proximity at the dielectric layer, the conductor in contact or close proximity to the dielectric layer can taper to an edge or point in some embodiments. More specifically, the conductor can taper to an edge or point where the conductor contacts or is in close proximity to the dielectric layer. Such as configuration is shown in FIG. 3, which shows the configuration of FIG. 2 with the conductor configured as knife-edge electrode 20. Knife-edge electrode 20 maintains a minimal area of surface contact at polymer layer 14. Other conductor configurations providing a low area of surface contact are also possible and reside within the spirit and scope of the present disclosure.

Figure 4A:
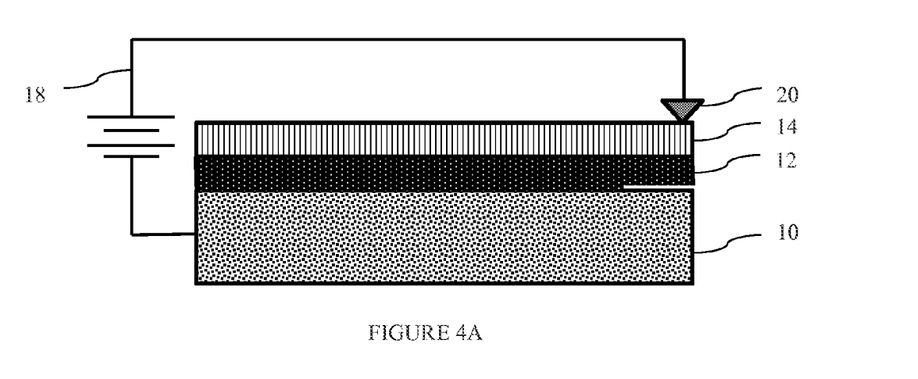
FIGS. 4A-4C show illustrative schematics of a process whereby graphene can be gradually removed from a metal substrate by moving a conductor across a dielectric layer over time.
Figure 4B:
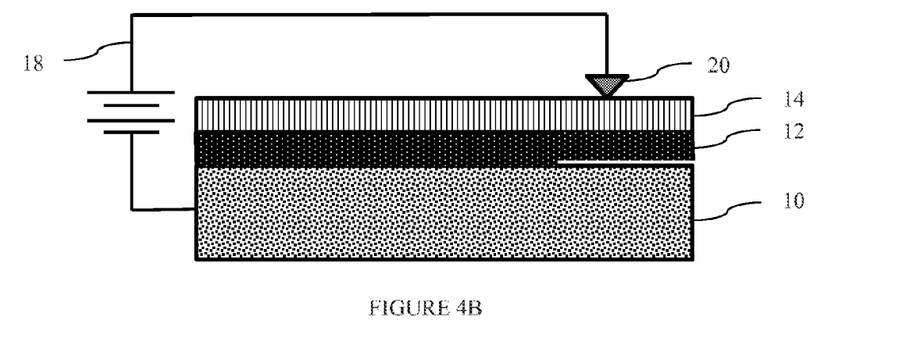
Figure 4C:
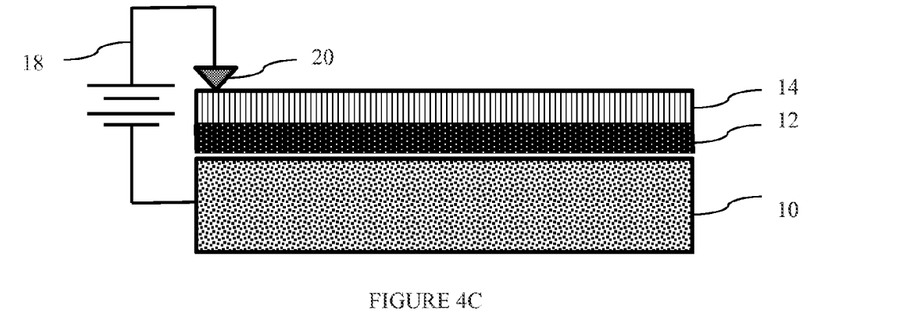

As described above, when the conductor is in contact with or in proximity to only a portion of the dielectric layer, the graphene can become only partially separated from the metal substrate. Although only partial separation of the graphene occurs in this configuration, it can provide energetic advantages, as described in more detail above. Moreover, the conductor can be placed in contact with or in proximity to the dielectric layer at a location where infiltration of the liquid medium between the graphene and the metal substrate is more likely to occur, such as at an edge of the coated structure. Thus, the applied potential can be "focused" where delamination is most likely to actively occur. After initial separation at the graphene from the metal substrate has occurred, a new edge can be exposed, at which further delamination can take place in the presence of an applied potential. Therefore, in some embodiments, the methods described herein can further include moving the conductor to a new position proximate to the dielectric layer (e.g., at a newly exposed edge), and maintaining an electrical potential at the new position until the graphene is released from the metal substrate at a second location. That is, by moving the conductor across the surface of the dielectric layer, the graphene can gradually be "peeled" from the metal substrate, exposing a new edge for infiltration of the liquid medium to take place at each "peeling" iteration. Movement of the conductor across the surface of the dielectric layer can continue until the graphene has been entirely released from the metal substrate. FIGS. 4A-4C show illustrative schematics of a process whereby graphene can be gradually removed from a metal substrate by moving a conductor across a dielectric layer over time.

Although the invention has been described with reference to the disclosed embodiments, those skilled in the art will readily appreciate that these only illustrative of the invention. It should be understood that various modifications can be made without departing from the spirit of the invention. The invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description.

What is claimed is the following:

1. A method comprising:
   providing a metal substrate having graphene adhered thereto;
   applying a dielectric layer to the graphene to form a coated structure;
   placing the coated structure in a liquid medium;
   establishing an electrical potential between the metal substrate and an electrode disposed about 10 mm or less from at least a portion of the dielectric layer;
      wherein the electrical potential induces infiltration of the liquid medium between at least a portion of the metal substrate and the graphene; and
      wherein establishing the electrical potential does not form hydrogen gas from the liquid medium; and
   releasing the graphene from the metal substrate in the presence of the infiltrated liquid medium, the electrical potential being maintained until the graphene is released.

2. The method of claim 1, wherein the dielectric layer comprises a polymer.

3. The method of claim 1, wherein the metal substrate comprises a copper substrate.

4. The method of claim 1, wherein the electrical potential is below a breakdown voltage of at least the dielectric layer.

5. The method of claim 1, wherein the liquid medium comprises an aqueous solution.

6. The method of claim 1, wherein the liquid medium comprises an aprotic organic solvent.

7. The method of claim 1, wherein the electrode is in contact with the dielectric layer while establishing the electrical potential.

8. The method of claim 1, wherein the electrode is disposed about 10 mm or less from only a portion of the dielectric layer at a particular time, the graphene being released from the metal substrate only at a first location.

9. The method of claim 8, further comprising:
   moving the electrode laterally with respect to the dielectric layer and the graphene to a new position also disposed about 10 mm or less from the dielectric layer; and
   maintaining an electrical potential at the new position until the graphene is released from the metal substrate at a second location.

10. The method of claim 1, wherein the electrode tapers to an edge or point at a location of closest approach to the dielectric layer.

11. The method of claim 1, wherein the graphene is adhered to the dielectric layer after being released from the metal substrate.

12. A method comprising:
   providing a coated structure comprising a metal substrate having graphene adhered thereto and a polymer layer coated on the graphene;
   forming an electrical connection to the metal substrate and an electrode disposed about 10 mm or less from at least a portion of the polymer layer;
   placing the coated structure in a liquid medium;
   establishing an electrical potential between the metal substrate and the electrode;
      wherein establishing the electrical potential does not form hydrogen gas from the liquid medium;
   infiltrating the liquid medium between at least a portion of the metal substrate and the graphene in the presence of the electrical potential; and
   releasing the graphene from the metal substrate in the presence of the infiltrated liquid medium, the electrical potential being maintained until the graphene is released.

13. The method of claim 12, wherein the electrical potential is below a breakdown voltage of at least the polymer layer.

14. The method of claim 12, wherein the liquid medium comprises an aqueous solution.

15. The method of claim 12, wherein the liquid medium comprises an aprotic organic solvent.

16. The method of claim 12, wherein the electrode is in contact with the polymer layer while establishing the electrical potential.

17. The method of claim 12, wherein the electrode is disposed about 10 mm or less from only a portion of the polymer layer at a particular time, the graphene being released from the metal substrate only at a first location.

18. The method of claim 17, further comprising:
   moving the electrode laterally with respect to the dielectric layer and the graphene to a new position also disposed about 10 mm or less from the polymer layer; and
   establishing an electrical potential at the new position until the graphene is released from the metal substrate at a second location.

19. The method of claim 12, wherein the electrode tapers to an edge or point at a location of closest approach to the polymer layer.

20. The method of claim 12, wherein the graphene is adhered to the polymer layer after being released from the metal substrate.

21. A method comprising:
  providing a coated structure comprising a metal substrate having graphene adhered thereto and a dielectric layer coated on the graphene;
  placing the coated structure in a liquid medium;
  disposing an electrode about 10 mm or less from the dielectric layer and establishing an electrical potential between the metal substrate and the electrode;
    wherein establishing the electrical potential does not form hydrogen gas from the liquid medium;
  moving the electrode laterally with respect to the dielectric layer and the graphene; and
  infiltrating the liquid medium between the metal substrate and the graphene as the electrode is moved laterally;
    wherein infiltration of the liquid medium releases the graphene from the metal substrate as the electrode is moved.

22. The method of claim 21, wherein the electrode tapers to an edge or point at a location of closest approach to the dielectric layer.

\* \* \* \* \*